United States Patent [19]
Koinuma et al.

[11] Patent Number: 5,569,502
[45] Date of Patent: Oct. 29, 1996

[54] FILM FORMATION APPARATUS AND METHOD FOR FORMING A FILM

[75] Inventors: Hideomi Koinuma, Tokyo; Masashi Kawasaki, Kanagawa; Masatomo Sumiya, Tokyo, all of Japan

[73] Assignee: Semiconductor Energy Laboratory Co., Ltd., Kanagawa-ken, Japan

[21] Appl. No.: 118,829

[22] Filed: Sep. 10, 1993

[30] Foreign Application Priority Data

Sep. 11, 1992 [JP] Japan .................................... 4-267932

[51] Int. Cl.$^6$ .................................................. B06B 1/00
[52] U.S. Cl. .................. 427/600; 427/248.1; 427/255.1; 427/255.2; 427/255.3; 427/255.4; 427/570; 427/578
[58] Field of Search ..................... 427/600, 570, 427/578, 248.1, 255.1, 255.2, 255.3, 255.4

[56] References Cited

U.S. PATENT DOCUMENTS 5,230,925  7/1993  Ohmine .............................. 427/255.3

Primary Examiner—Shrive Beck
Assistant Examiner—David M. Maiorana
Attorney, Agent, or Firm—Sixbey, Friedman, Leedom & Ferguson, PC; Gerald J. Ferguson, Jr.; Jeffrey L. Costellia

[57] ABSTRACT

A process and apparatus for depositing a film as desired on the surface of a substrate yet at a low temperature, said process comprising introducing a product gas into a film deposition chamber having provided therein a substrate being mounted on a support, and depositing a film on the surface of said substrate by activating said product gas inside said film deposition chamber while applying ultrasonic oscillation to said substrate.

20 Claims, 9 Drawing Sheets

170°C, Si(III)
Std. dev. 9.90nm

10 MHz, 170°C
Std. dev. 6.48 nm

FILM FORMATION APPARATUS AND METHOD FOR FORMING A FILM

BACKGROUND OF THE INVENTION

1. Field of the Invention

The present invention relates to a process for depositing desired films on the surface of a substrate, and to an apparatus for film deposition.

2. Prior Art

Referring to a schematically drawn view in FIG. 7, a conventional process for depositing a film on a substrate is described below.

A film deposition chamber 71 comprises a substrate support 73 for mounting thereon a substrate 72 to deposit a film on the surface thereof, a cathode 74 for applying high frequency power to activate the product gas to deposit a film on the surface of the substrate 72, an inlet 75 for introducing product gas as a starting material for the film, and an outlet 76 for controlling the pressure inside the chamber to facilitate film deposition on the substrate 72.

The cathode 74 is connected to a high frequency power source 78 to apply a power to the product gas for the activation of the gas. The substrate support 73 is heated by a heater 79 to control the temperature thereof to provide a condition suited for film deposition.

In depositing an amorphous silicon film by plasma-assisted chemical vapor deposition (plasma CVD) using monosilane as the starting material, for instance, a high frequency power of 13.56 MHz is applied to the cathode 74 while controlling the pressure inside the film deposition chamber 71 to 300 mTorr and the temperature of the substrate 72 to 300° C. A plasma forms on introducing monosilane as the product gas into such a film deposition chamber 71 having its temperature and pressure suitably controlled to obtain an amorphous silicon film deposit on the substrate 72 being heated with a heater 79. The film can be deposited on the surface of the substrate 72 not only by plasma CVD, but also by a process such as photochemical vapordeposition (photo-CVD), thermal CVD, physical vapor deposition (PVD), deposition using electron cyclotron resonance, vapor deposition, sputtering, and laser ablation.

Various types of films can be deposited on the substrate 72 in the place of the amorphous silicon film above, and included are a diamond film, a ceramics film, a semiconductor film, an insulator film, a metallic film, and a superconductor film.

An amorphous silicon film having deposited by plasma CVD process at a low temperature (any temperature from room temperature to 100° C.), however, suffers poor photoconductivity. An improved photoconductivity can be obtained only by elevating the temperature of the substrate to, for example, 300° C.

When a substrate such as a polymer film having inferior resistance against heat is used, however, the process above cannot be applied. Furthermore, when the substrate is heated to 300° C. in fabricating solar cells, transistors of liquid crystal panels, etc., the substrate readily undergoes reaction with the transparent electrode during the film deposition.

In addition to the shortcomings above, it further is a problem in vapor phase synthesis because it comprises vapor phase reaction and surface reaction in which the latter cannot be controlled.

The present invention is accomplished for overcoming the problems above, and it provides a film deposition process for depositing films on the surface of a substrate at a low temperature while rendering desired characteristics to the deposited film. The present invention also provides an apparatus for depositing such films.

SUMMARY OF THE INVENTION

According to a first embodiment of the present invention, there is provided a film deposition process which is characterized by that it comprises introducing a product gas (a reaction gas) into a film deposition chamber (a film formation space) 1 (see FIG. 1) having provided therein a substrate and depositing a film on the surface of a substrate 5 (see FIG. 1) while activating the product gas inside the chamber 1 and simultaneously applying ultrasonic oscillation (vibration) to the substrate having placed inside the chamber to vibrate the substrate at an ultrasonic frequency during the deposition of the film.

A second embodiment according to the present invention provides a film deposition process which comprises depositing a film on the surface of a substrate 31 (see FIG. 3) having provided inside a film deposition chamber 1, characterized by that surface acoustic waves (SAW) are allowed to generate on the substrate 31 during deposition of the film to vibrate the substrate. A reaction gas is introduced into the film deposition chamber 1 and is activated in the film deposition chamber 1.

A third embodiment according to the present invention provides a film deposition process which is characterized by that at least one of frequency and output power of the applied ultrasonic oscillation (vibration) is adjusted to control the properties and the quality of the film being deposited on a substrate 5 (in FIG. 1) or 31 (in FIG. 3).

A fourth embodiment according to the present invention provides a film formation apparatus (an apparatus for depositing a film), which is characterized by that it comprises a film deposition chamber (a film formation space) 1 (see FIG. 1) furnished with an inlet (an introducing means) for introducing a product gas (a reactive gas) and an outlet (an exhausting means) for controlling the inner chamber pressure to a predetermined value by evacuation, an apparatus (an activating means) 8 (see FIG. 1) for activating the product gas having introduced into said film deposition chamber 1, a substrate support (holder) 2 (see FIG. 1) being placed inside the chamber and which can be heated, a piezoelectric element 4 (see FIG. 1) being connected with the power source for generating a vibration e.g. ultrasonic wave in said element, and a substrate 5 (see FIG. 1) for depositing thereon a film, said substrate 5 being mounted on said piezoelectric element having provided on said substrate support 2. The substrate can be held by the substrate support 2 and can be heated by a heater of the substrate support 2.

A fifth embodiment according to the present invention provides a film deposition apparatus which is characterized by that it comprises a piezoelectric element 4 (see FIG. 1) equipped with at least one reference electrode 3" (see FIG. 1) for monitoring the generation of the oscillation (vibration).

A sixth embodiment according to the present invention provides a film deposition apparatus which is characterized by that it comprises a substrate support 2 (see FIG. 1) which undergoes ultrasonic oscillation (vibration) at an ultrasonic frequency.

DETAILED DESCRIPTION OF THE INVENTION

Figure 1:
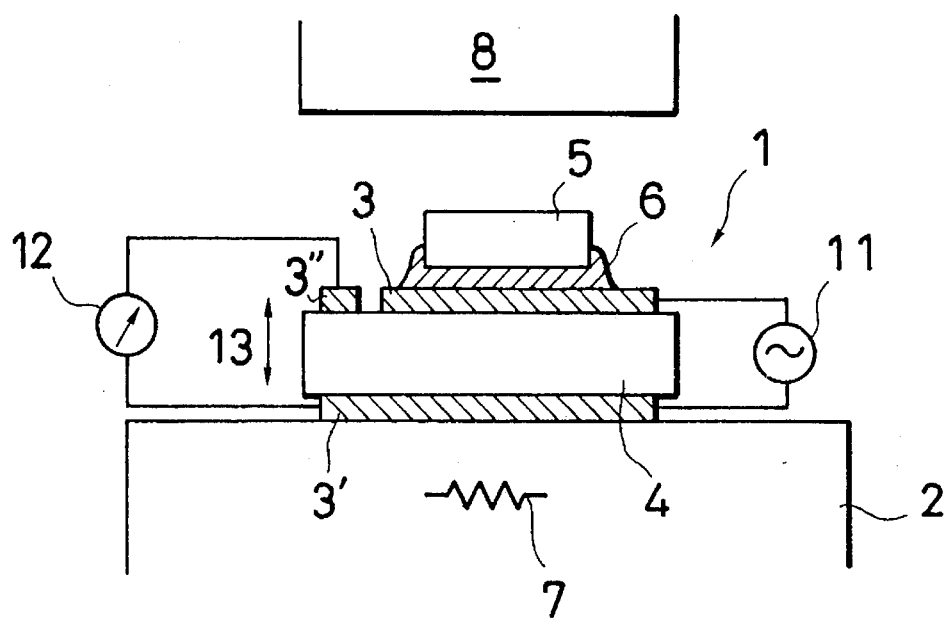
FIG. 1 is a schematic view of a film deposition apparatus, provided as an explanatory means for an embodiment according to the present invention.

In the process according to the first and the fourth embodiments of the present invention, the deposition of a film is accelerated by additionally applying ultrasonic oscillation (vibration) to the substrate while activating the product gas inside the film deposition chamber.

The film deposition process according to the present invention takes advantage of ultrasonic oscillation (vibration) and thereby enables deposition of a film having a smoother surface as compared to the films deposited by conventional processes. Furthermore, a film having desired properties can be deposited on the surface at a temperature lower than any conventional process similar to the present one.

The process is also effective in burying grooves and indentations by depositing a film, because ultrasonic oscillation (vibration) is applied to the substrate having such uneven surface.

In a second embodiment according to the present invention, a member capable of generating surface acoustic waves (SAW) is used as a substrate on which the film is to be deposited. For instance, a comb-shaped electrode may be attached to the surface of the substrate to generate SAW thereon.

Furthermore, multiple films differing in properties from each other may be deposited on a same single substrate by providing a plurality of the comb-shaped electrodes in a parallel arrangement.

In a third embodiment according to the present invention, the ultrasonic oscillation (vibration) applied to the substrate can be varied by changing the shape and the like of the piezoelectric device. The output ultrasonic oscillation generating from the piezoelectric device can be changed in addition.

The crystal structure of the deposited film can be varied in the film deposition process according to the present invention by changing either or both of the oscillation frequency and the output of the ultrasonic oscillation (vibration).

According to the fifth embodiment according to the present invention, for example, a third electrode is provided to the electrode of the piezoelectric device for generating the ultrasonic oscillation (vibration), to thereby monitor the state (frequency and/or output) of the piezoelectric device generating the ultrasonic oscillation (vibration). The monitored state may be referred in controlling the film being deposited on the surface of the substrate.

In the sixth embodiment according to the present invention, the portion for heating the substrate is provided distant from the portion generating ultrasonic oscillation (vibration), because the piezoelectric device for generating ultrasonic oscillation (vibration) would not function at higher temperatures. More specifically, ultrasonic oscillation (vibration) is applied to solely the base of the support for mounting thereon a substrate to thereby prevent the piezoelectric device from being heated by the heater.

The ultrasonic vibration can be caused on the substrate by applying an alternating voltage between a pair of electrodes sandwiching the piezoelectric element and provided on the substrate support.

The present invention is illustrated in greater detail referring to non-limiting examples below and to schematically drawn cross sections. It should be understood, however, that the present invention is not to be construed as being limited thereto.

Embodiment 1

Referring to a schematic view in FIG. 1, the film deposition apparatus according to an embodiment of the present invention is described below.

Figure 7:
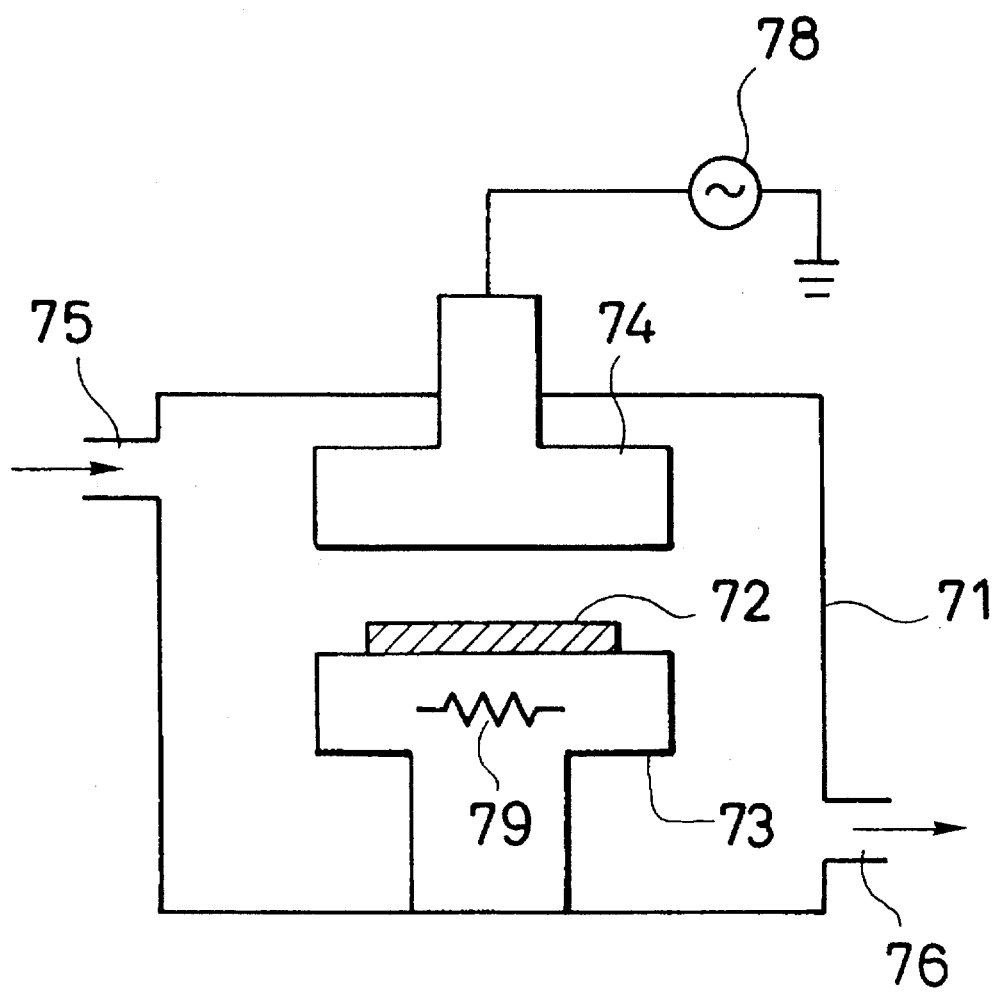
FIG. 7 is a schematic view provided as an explanatory means to show a conventional process for depositing a film on the surface of a substrate.

The film deposition chamber 1 is the same as the one in a conventional apparatus shown in FIG. 7, and is thereby omitted. The process according to the present example is distinguished from a conventional process referring to FIG. 7 in that a film is deposited while applying ultrasonic oscillation (vibration) to a substrate 5.

The film deposition chamber i comprises a substrate heating support 2 equipped with a heater 7, and a piezoelectric device 4 comprising an upper and a lower electrode 3 and 3' for applying electric current to the piezoelectric device 4. The piezoelectric device may be made, for example, from quartz crystal, Rochelle salt, lithium niobate, barium titanate, potassium sodium tartrate, and lead titanate zirconate (PZT), as well as other organic piezoelectric substances and piezoelectric ceramics. The piezoelectric device 4 is mounted on the heating support 2 in such a manner that the lower electrode 3' is fixed to the heating support 2 and that the substrate 5 is mounted on the upper electrode 3. The substrate 5 is fixed to the upper electrode 3 using, for example, indium. The substrate 5 may be fixed to the electrode 3 by using, alternatively, a hard solder, a soft solder, an adhesive, etc. Otherwise, the substrate 5 may be fixed to the electrode 3 by fitting protrusions or by locking the fitting elements provided to the electrode 3. The substrate 5 not necessarily be fixed to the electrode 3, and whether it should be fixed or not depends on the mode of oscillating the substrate and on the relative size of the substrate 5 with respect to the piezoelectric device 4.

By thus fixing the substrate 5 using indium 8 on one 3 of the electrodes provided to the piezoelectric device 4, an amorphous silicon film is deposited by, for example, plasma CVD.

The plasma CVD process comprises introducing a product gas based on monosilane from an inlet (not shown in FIG. 1) into the film deposition chamber i whose pressure is controlled to 30 mTorr and which is equipped with a substrate being heated to 50° C. using a heater 7. A high frequency power at an output of 13.56 MHz is applied to the product gas from a cathode 8. By introducing monosilane into the film deposition chamber 1 in this manner, a plasma of monosilane is generated to form an amorphous silicon film on the surface of the substrate 5. The film characteristics of the thus deposited film can be varied by changing the frequency of the ultrasonic oscillation (vibration) being applied from the piezoelectric device 4 in the range of from 1 kHz to 10 MHz.

The film can be deposited on the surface of the substrate 5 not only by the plasma CVD (chemical vapor deposition) process above, but by a method such as photochemical vapor deposition (photo-CVD), thermal CVD (chemical vapor deposition), physical vapor deposition (PVD), deposition using electron cyclotron resonance, vapor deposition, evaporation, sputtering, and laser ablation.

Furthermore, a variety of films can be deposited on the substrate 5 instead of the amorphous silicon film above, and included are a diamond film, a ceramics film, a semiconductor film, an insulator film, a metallic film, and a superconductor film.

Figure 2:
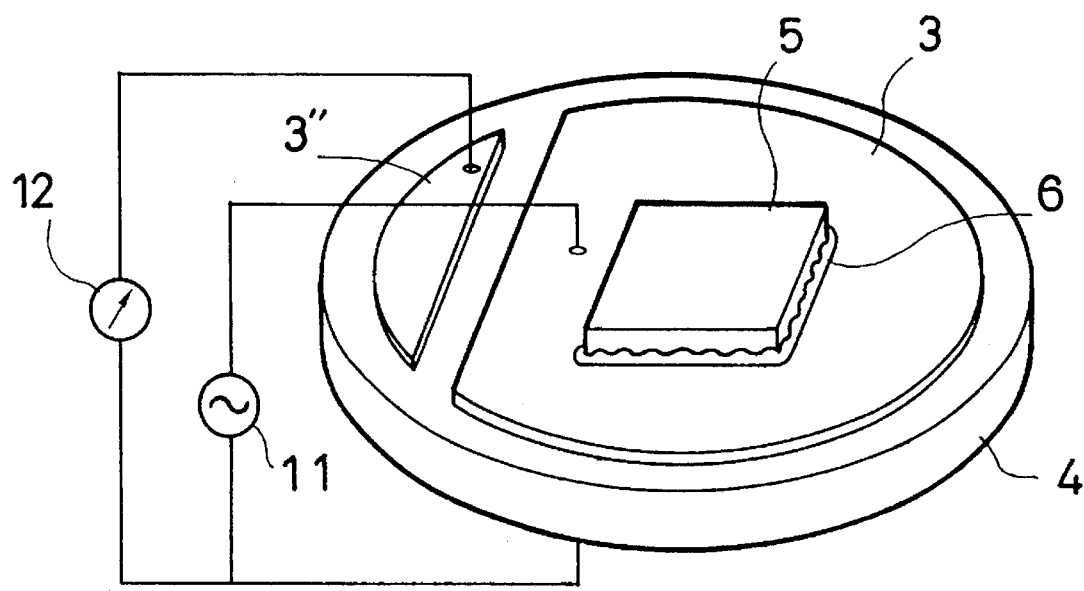
FIG. 2 is an enlarged perspective view of a piezoelectric device shown in FIG. 1.

Referring to an enlarged perspective view of FIG. 2, the piezoelectric element shown in FIG. 1 is described below.

A power source 11 for generating ultrasonics is connected to an electrode 3. A reference electrode 3" is provided on the piezoelectric element as an electrode partially separated from the electrode 3. The reference electrode 3" is connected with, for example, a voltmeter for monitoring the film deposition process. The generation efficiency of the ultrasonic oscillation (vibration) can be controlled by monitoring the voltmeter.

The direction and the frequency of the oscillation being generated by the piezoelectric device 4 can be selected by changing the cut direction of the crystal used therein. Furthermore, the piezoelectric device 4 can realize a variety of oscillation modes, such as the oscillation along the vertical direction as indicated with arrows shown in FIG. 1, a oscillation along the horizontal direction, a slip oscillation, and a flexural oscillation.

It can be seen from the foregoing that the frequency and the direction of the oscillation of a piezoelectric device 4 can be varied by changing, for example, the material, the size, and the cutting direction of the crystal being used in the device. Furthermore, the oscillation output can be changed by monitoring with a voltmeter. Accordingly, a film of desired characteristics can be obtained by selecting the above conditions in accordance with the material of the film.

Figure 3:
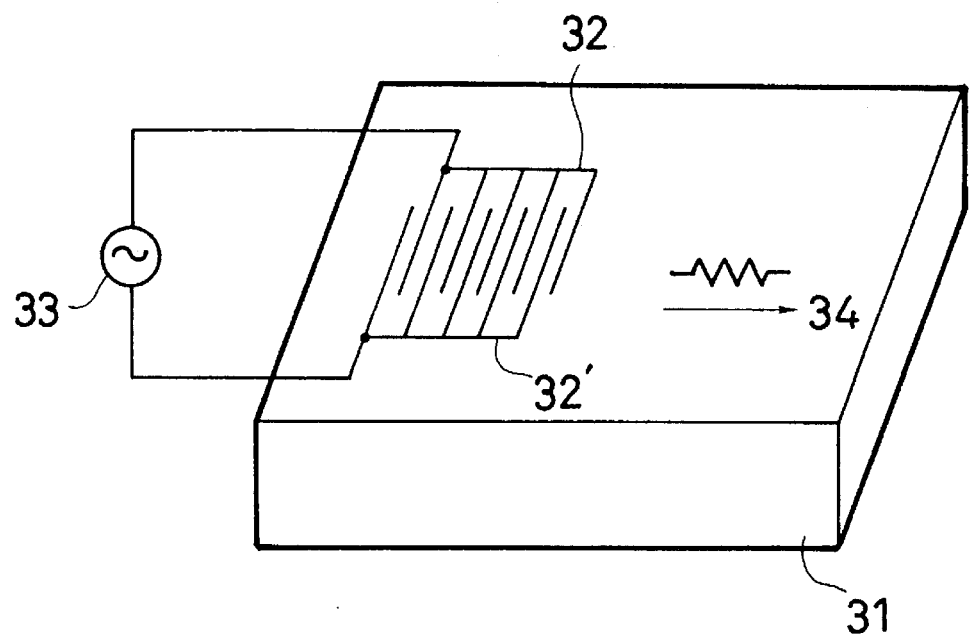
FIG. 3 is an explanatory schematic view to show a method for oscillating a substrate according to another embodiment of the present invention.

Referring to FIG. 3, the method for oscillating a substrate according to another embodiment of the present invention is described below.

Comb-shaped electrodes 32 and 32' are provided on the surface of a substrate 31 obtained by Z-cutting a bulk of, for example, lithium niobate. A power source 33 for generating ultrasonics is provided between the comb-shaped electrodes 32 and 32'. By setting the substrate 31 as above, SAW can be generated on the surface thereof.

Furthermore, multiple films differing from each other in properties may be deposited on a single substrate 31 by providing a plurality of the comb-shaped electrodes 32 and 32' in a parallel arrangement, because SAW differing in frequency can be generated simultaneously.

Figure 4:
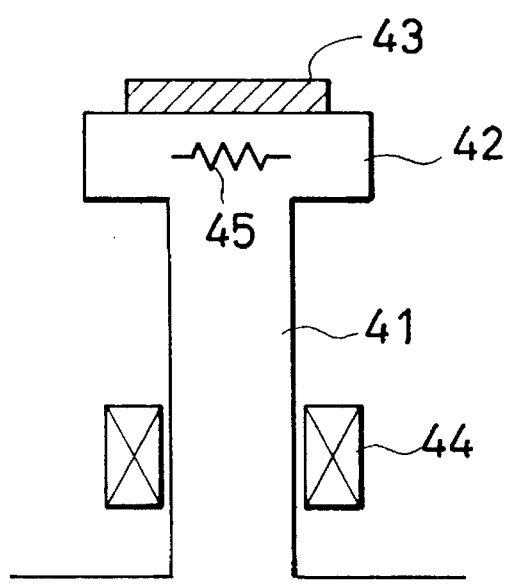
FIG. 4 is an explanatory schematic view to show another method for oscillating a substrate according to an embodiment of the present invention but differing from that shown in FIG. 3.

Referring to FIG. 4, the method for oscillating a substrate according to another embodiment of the present invention and differing from that described in reference to FIG. 3 is described below.

A heating table 42 equipped with a heater 45 is provided on the upper portion of the support 41. A substrate 43 is mounted or fixed on the heating table 42. An ultrasonic oscillator (vibrator) 44 is provided on the support 41 distant from the heating table 42, but ultrasonic oscillation (vibration) is applied to the substrate 43 together with the support 41 and the heating table 42.

It can be seen from the foregoing that in the embodiment according to the present example, the heater 45 for heating the substrate 43 is provided far apart from the ultrasonic oscillator (vibrator) 44. In this manner, the piezoelectric device 4 can be prevented from being affected by thermal influence which occurs due to the heat generated by the heater 7. Hence, ultrasonic oscillation (vibration) can be stably generated by the piezoelectric device 4.

Figure 5:
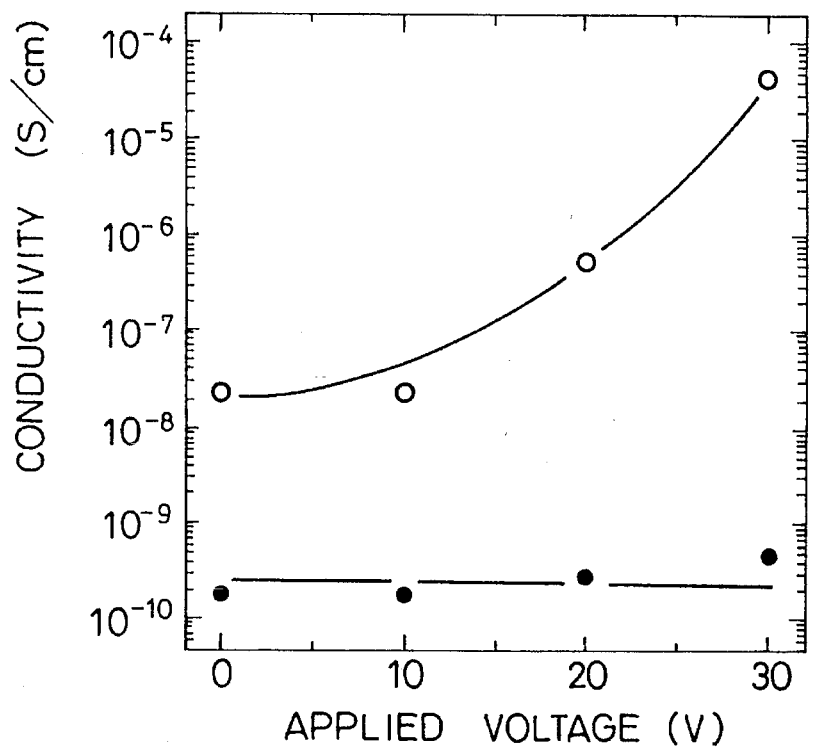
FIG. 5 is a graph showing the photoconductive properties of amorphous silicon obtained with plasma CVD according to the present invention.

Referring to FIG. 5, the photoconductive properties of amorphous silicon obtained by the present invention is described below. An improved film characteristics of a film obtained by the present invention is illustrated in FIG. 6.

Figure 6:
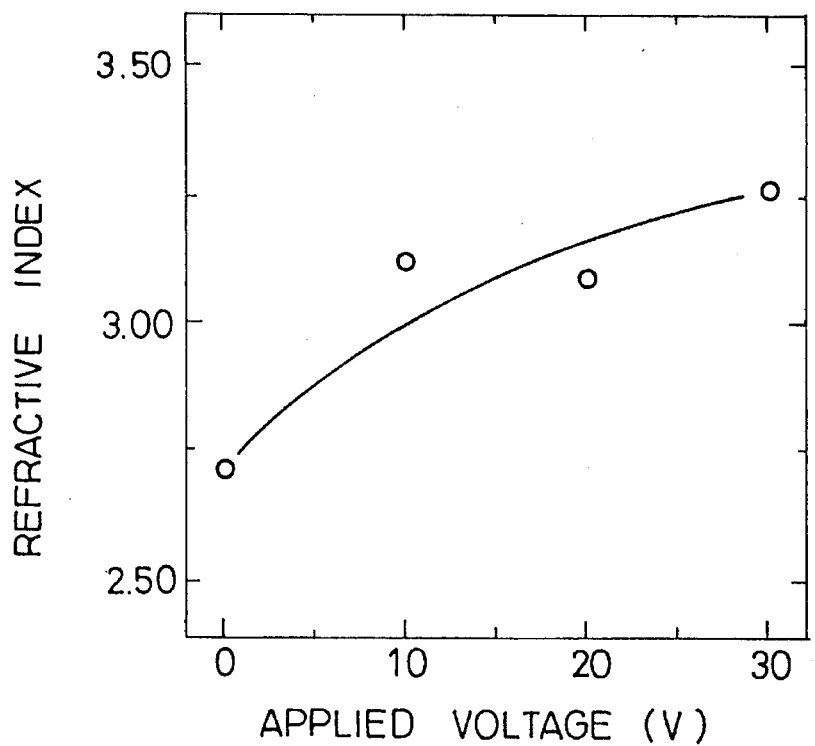
FIG. 6 is a graph showing refractive index of improved film properties of amorphous silicon with plasma CVD obtained according to the present invention.

The films on which the properties of FIGS. 5 and 6 were obtained were deposited in the same manner as in the Examples described hereinbefore. Accordingly, the films were deposited from monosilane gas on a substrate being maintained at 50° C. under an inner-chamber pressure of 30 mTorr, while applying a high frequency power of 13.56 MHz and by using a PZT piezoelectric device being oscillated at 2 MHz.

The change of conductivity (S/cm) of an amorphous silicon film having deposited under the conditions above with varying applied ultrasonic voltage from 0 to 30 V is illustrated in FIG. 5. In the figure, the conductivity read for 0 V corresponds to an amorphous silicon film obtained by a conventional process with no ultrasonics being applied. It can be seen from the graph that the photoconductivity is greatly improved with increasing voltage of applied ultrasonics as compared with the film obtained by a conventional process, yet without considerably increasing the dark conductivity.

The change of refractive index of an amorphous silicon film having deposited under the conditions above with varying applied ultrasonic voltage from 0 to 30 V is shown in FIG. 6. In the figure, the refractive index read for 0 V corresponds to an amorphous silicon film obtained by a conventional process with no ultrasonics being applied. It can be seen from the graph that the refractive index is greatly improved with increasing voltage of applied ultrasonics as compared with the film obtained by a conventional process, and that the film quality is greatly improved.

Figure 8:
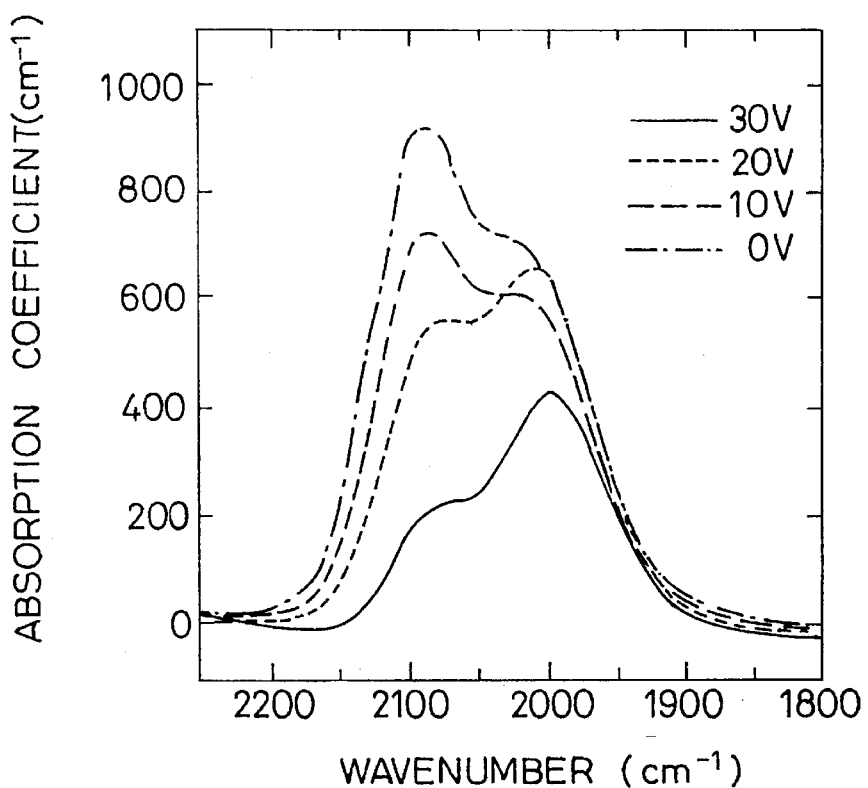
FIG. 8 shows infrared absorption spectra of amorphous silicon films by plasma CVD with varying an applied ultrasonic voltage.

FIG. 8 shows infrared absorption spectra of amorphous silicon films formed on substrate surfaces with varying an applied ultrasonic voltage from 0 to 30 V under the above described film formation conditions.

Hydrogen contents are decreased from 19% to 7% and absorption of Si-H$_2$ (2100 cm$^{-1}$) are dramatically decreased with increasing the applied ultrasonic voltage. It is understood from these that a film quality is improved by influence of the ultrasonic wave on a hydrogen capturing reaction on the film surface.

Embodiment 2

An amorphous silicon film having only Si-H (2000 cm$^{-1}$) in an infrared absorption spectrum thereof and manufactured without application of an ultrasonic wave thereto is manufactured with changing the reaction conditions of Embodiment 1 as follows. Pressure inside the film formation space is changed to 100 mTorr, and flow rate of monosilane is changed to 10 sccm.

Figure 9:
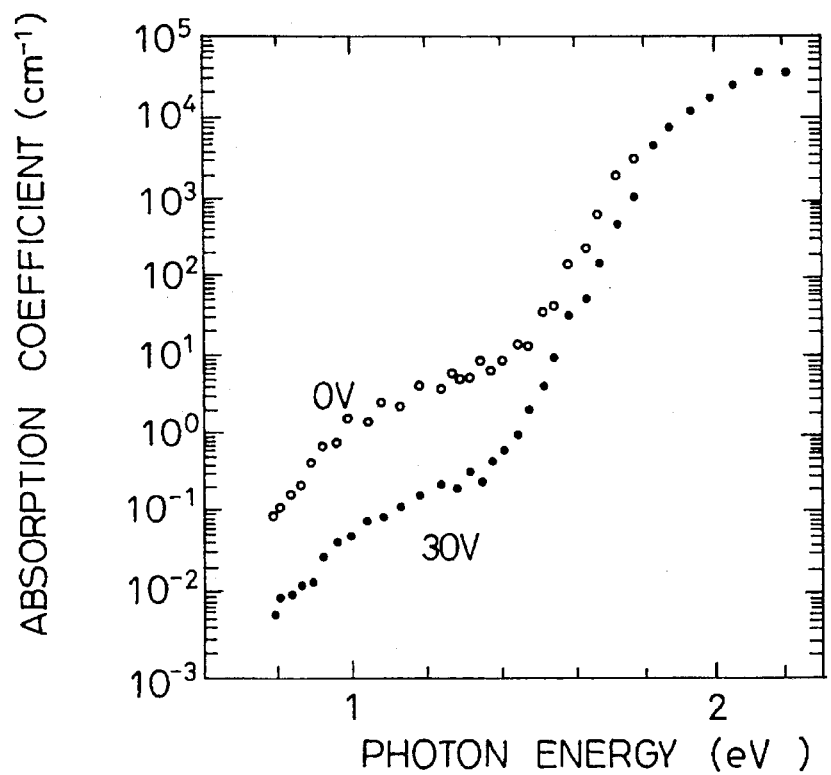
FIG. 9 shows CPM spectra of the amorphous silicon films deposited by plasma CVD without ultrasonic and with 30 V application.

Two amorphous silicon films are formed at applied ultrasonic voltages of 0 V and 30 V under the above described conditions. Defect densities of the two amorphous silicon films are estimated by CPM (constant photocurrent method). FIG. 9 shows CPM spectra thereof. Absorption on the low energy from 0.8 to 1.3 eV represents the defect density of the films, and the defect density of the conventional film (in case of 0 V) is $1.0 \times 10^{16}$ cm$^{-3}$, and that of the film in case of 30 V of the applied ultrasonic wave is decreased to be $7.9 \times 10^{14}$ cm$^{-3}$. Thus, an amorphous silicon having a low defect density can be formed at a low temperature of 120° C. Magnitude of a gradient of the CPM spectrum from 1.4 to 1.8 eV represents minuteness of a network structure of the amorphous silicon. Although the gradient of the conventional film is 16 eV, that of the film in case of 30 V of the applied ultrasonic wave is improved to be 20 eV, that is, the network structure is minute.

Embodiment 3

In Embodiment 3, a thin film is formed with an ultrasonic vibration being applied to a substrate intermittently. By the intermittent application of the ultrasonic vibration, it is possible to laminate a number of films having different film quality and different film structure in a superlattice structure in the direction of the lamination. For example, since it has been observed that hydrogen content in an amorphous silicon is decreased by applying an ultrasonic wave thereto during formation of the amorphous silicon, a superlattice structure which comprises a hydrogen rich layer and a hydrogen poor layer can be formed. Unlike the embodiments in which film quality is ameliorated by the continuous application of the ultrasonic wave, a film quality and a film structure can be ameliorated by varying an amplitude of an ultrasonic vibration of the substrate with time in Embodiment 3.

An amorphous silicon is deposited with a gate oscillation of an ultrasonic wave at 2 MHz. Experiment conditions of Embodiment 3 are as follows.

Product gas: monosilane 3 sccm

Piezoelectric element: PZT 2 MHz 30 V

Gate frequency: $5 \times 10^4$ to $1 \times 10^{-1}$ Hz (duty ratio: 50%)

Frequency of a high frequency power source: 13.56 MHz

Substrate temperature: 120° C.

Pressure inside film formation space: 10 mTorr

Figure 10:
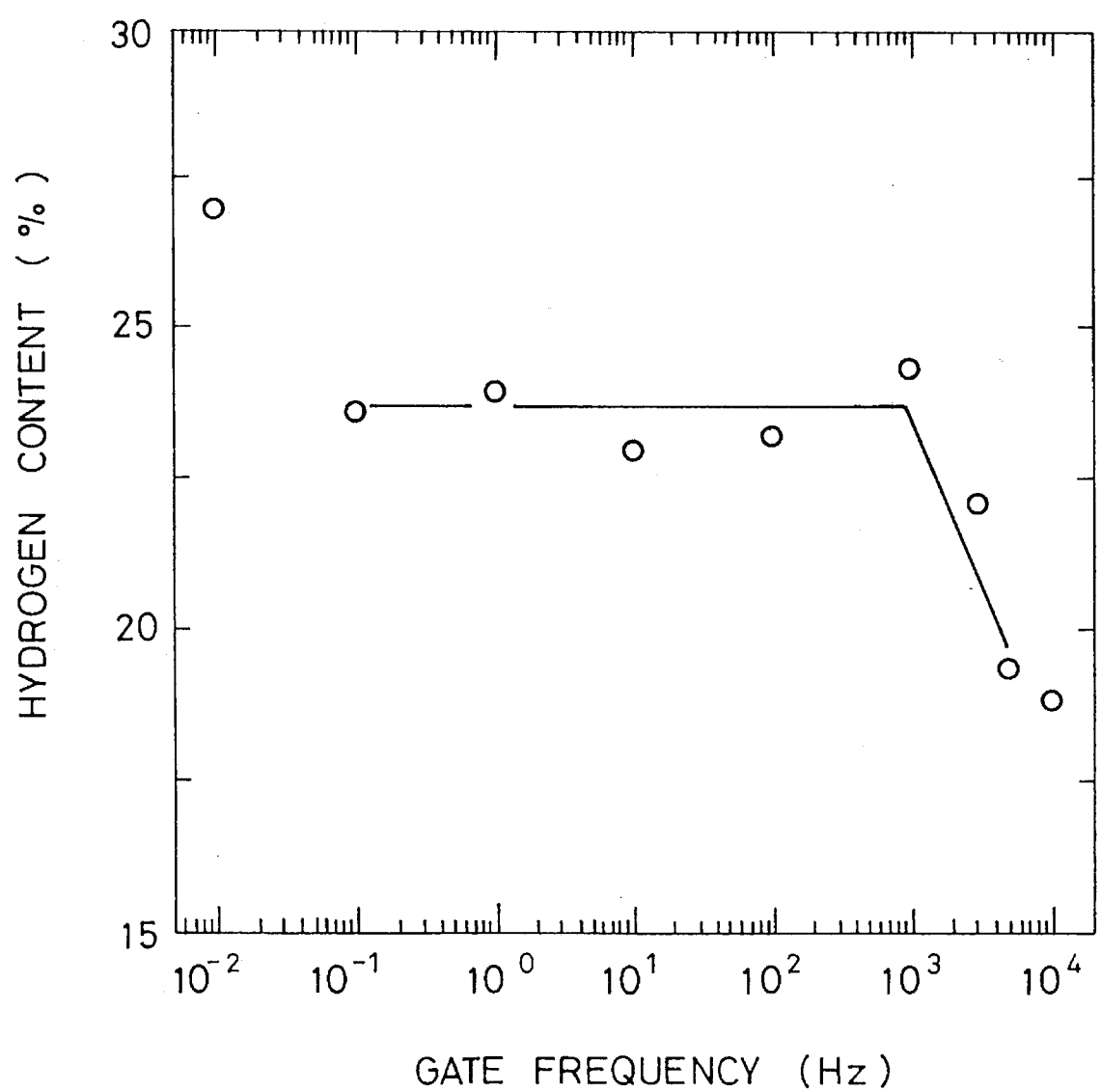
FIG. 10 shows hydrogen contents of the amorphous silicon.

FIG. 10 shows hydrogen contents of the amorphous silicon with varying the gate frequency. A flat portion of the curve in FIG. 10 which corresponds to gate frequencies from $10^{-1}$ to $10^3$ Hz has an intermediate value of hydrogen content between values in cases of application of a continuous ultrasonic wave and no application thereof. In this gate frequency range, a superlattice like amorphous silicon which comprises a hydrogen rich layer and a hydrogen poor layer is formed by turning on and turning off the ultrasonic wave. In a gate frequency higher than $10^3$ Hz, the hydrogen content approaches a hydrogen content in case of continuous application of the ultrasonic wave owing to reaction time required for capturing hydrogen in the film. Hydrogen content in the amorphous silicon film can be varied by the gate oscillation of the ultrasonic wave without varying a substrate temperature to improve the film quality.

Embodiment 4

An amorphous silicon is deposited by photo CVD which is a thin film formation process without an ion in the reaction space, rather than plasma CVD. Effect of ultrasonic wave is examined in photo CVD. Experiment conditions of Embodiment 4 are as follows.

Product gas: disilane 3 sccm

Piezoelectric element: PZT 2 MHz 0 to 30 V

Substrate temperature: 135° C.

Pressure inside film formation space: 50 mTorr

Excitation source: low pressure mercury lamp

Figure 11:
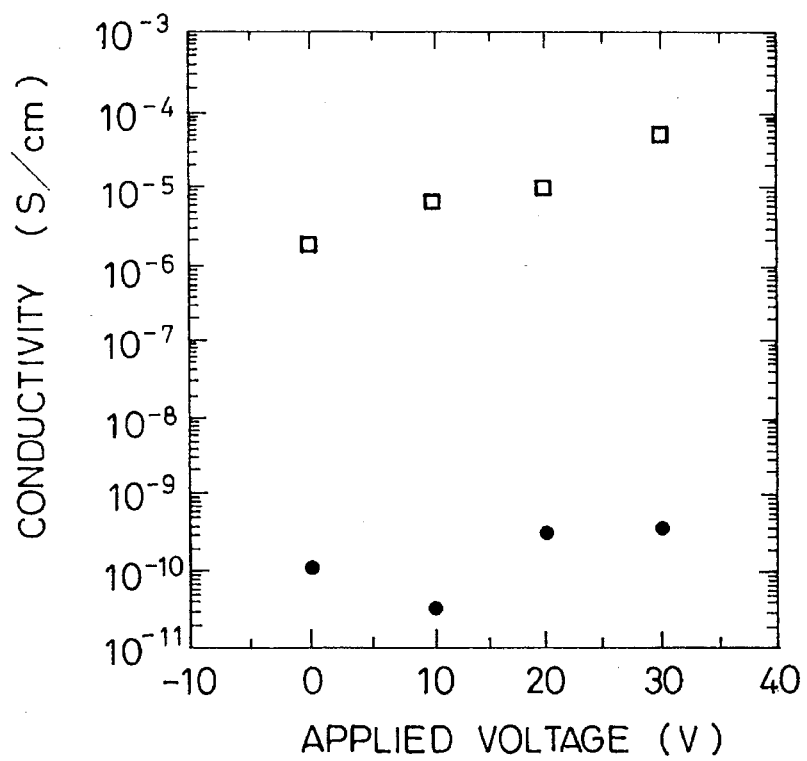
FIG. 11 shows photoconductivity of amorphous silicon films deposited by photo CVD versus an applied ultrasonic voltage.
Figure 12:
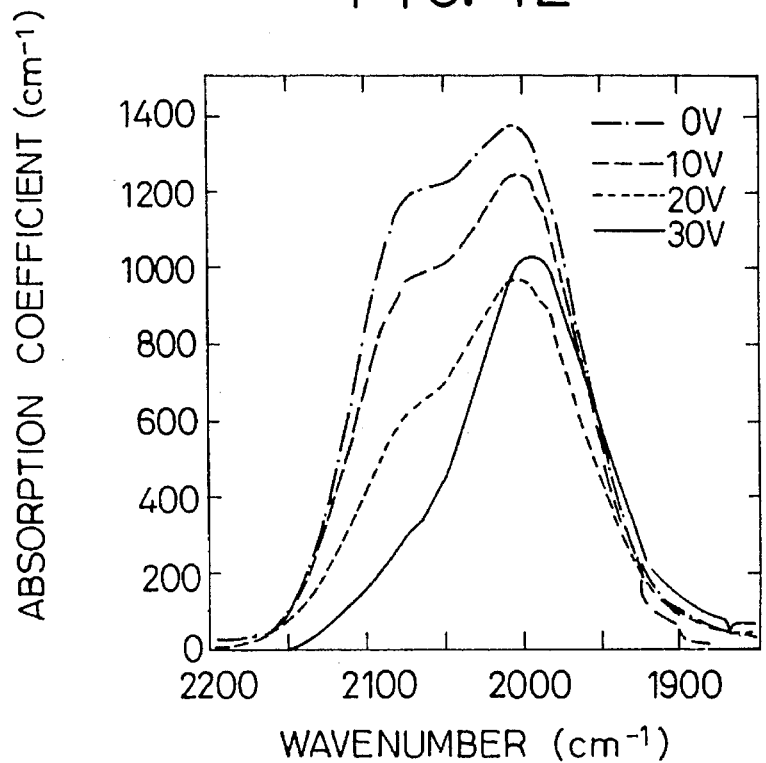
FIG. 12 shows infrared absorption spectra of a-Si film deposited by photo CVD with a number of applied ultrasonic voltages.

FIG. 11 shows an applied ultrasonic voltage versus photoconductivity. FIG. 12 shows infrared absorption spectra with a number of the applied ultrasonic voltages.

Effect of the ultrasonic wave application in the case, of the photo CVD process is the same as that in the case of Embodiment 1 to improve the film quality.

Embodiment 5

Although Embodiments 1 to 4 relate to amorphous silicon film having a bonding by covalent force, an effect of the ultrasonic wave on $C_{60}$ thin film having a bonding by van der Waals forces is examined in Embodiment 5. The $C_{60}$ thin film is formed by evaporation under the following conditions.

$C_{60}$: 10 mg, purity of 99.5% or higher

Crucible temperature: 500° C.

Distance between substrate and crucible: 11 cm

Substrate temperature: 170° C.

Ultrasonic wave: 10 MHz 30 V

Figure 13A:
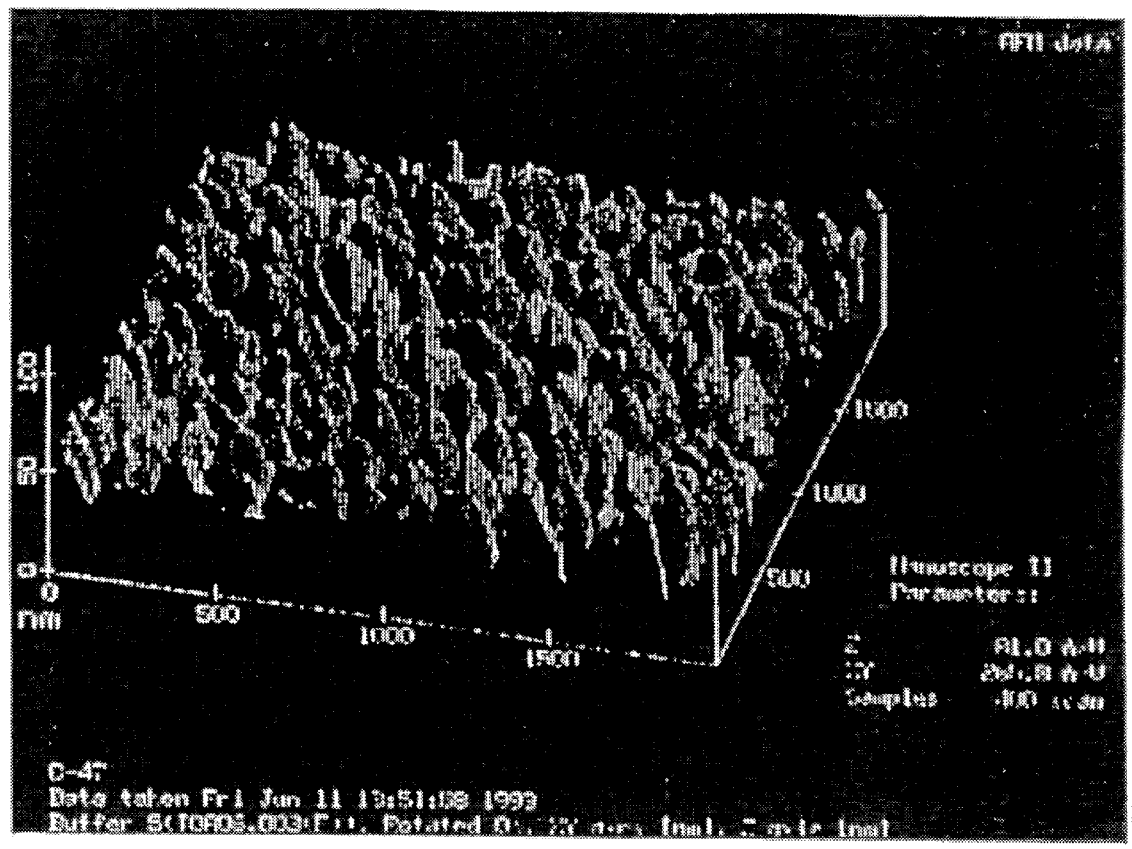
FIGS. 13(A) and 13(B) are AFM images showing surfaces of $C_{60}$ films without application of ultrasonic (A) and with application of 10 MHz and 30 V ultrasonic vibration (B).
Figure 13B:
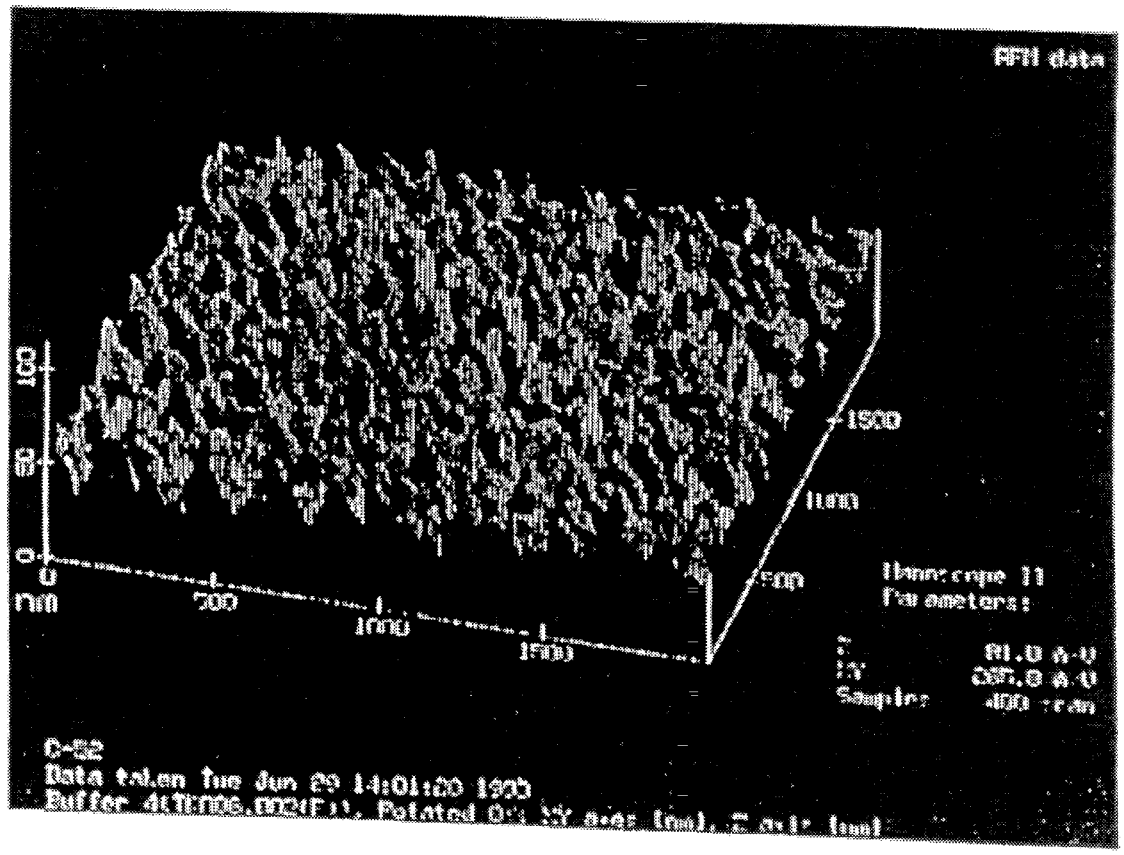

FIGS. 13(A) and 13(B) are AFM images (atomic force microscope images) showing surfaces of the $C_{60}$ thin films observed by atomic force microscope in case of application of ultrasonic waves of 0 V and 30 V respectively for the formation of the $C_{60}$ thin films. A route mean square value to exhibit roughness of the $C_{60}$ film surface is 9.90 nm under no application of an ultrasonic wave. By applying an ultrasonic wave at 30 V and 10 MHz, the value is decreased to be 6.48 nm to improve flatness of the surface.

The present invention was described in detail in the foregoing, but it should be understood that it is not to be construed as being limited thereto. Accordingly, various types of design modifications are acceptable so far that they do not depart from the claimed range.

In the embodiments above, amorphous silicon films were deposited on the substrates by plasma CVD and photo CVD and a $C_{60}$ film was deposited on the substrate by evaporation to describe the effect of the present invention, but other methods, such as thermal CVD, physical vapor deposition (PVD), deposition using cyclotron resonance, vapor deposition, sputtering, and laser ablation, may be used alternatively for depositing the films. Moreover, a variety of films with improved film quality can be deposited on the substrate instead of the amorphous silicon film and the $C_{60}$ film above, and included are a diamond film, a ceramics film, a semiconductor film, an insulator film, a metallic film, and a superconductor film.

As a matter of course, the conditions for film deposition, such as the type of the product gas and the piezoelectric device, the oscillation frequency of the piezoelectric device, the frequency of the high frequency power source, the heating temperature of the substrate material, and the pressure inside the film deposition chamber, vary depending on the type and kind of the film to be deposited and the substrate material on which the film is to be deposited, as well as on the method of depositing the film.

As described in detail in the foregoing, the process according to the present invention provides a film of improved film quality or with a smooth surface by controlling surface reaction with applying ultrasonic oscillation (vibration) to the substrate on depositing the film on the substrate.

Furthermore, the process according to the present invention provides a film whose crystal structure is controlled as desired by properly adjusting the ultrasonic oscillation (vibration) being applied to the surface of the substrate.

In addition, the process is also effective in burying grooves and indentations by depositing a film, because the film is deposited while applying ultrasonic oscillation to the substrate.

While the invention has been described in detail and with reference to specific embodiments thereof, it will be apparent to one skilled in the art that various changes and modifications can be made therein without departing from the spirit and scope thereof.

What is claimed is:

1. A method for forming a film comprising the steps of:
providing a substrate in a film formation space;
introducing a reaction gas into said film formation space;
activating said reaction gas in said film formation space; and
depositing an amorphous silicon film on said substrate by plasma chemical vapor deposition,
wherein said substrate is vibrated at an ultrasonic frequency during the deposition of said film with conditions of the vibration being adjusted to obtain characteristics for said film wherein said characteristics are a function of the vibration conditions.

2. The method of claim 1 wherein said substrate is vibrated by generating a surface acoustic wave in said substrate during the deposition of the film.

3. The method of claim i wherein said frequency and/or an output of the vibration are controlled to control a quality of said film.

4. The method of claim 1 wherein said substrate has an uneven surface.

5. The method of claim 1 wherein said substrate is vibrated by using a piezoelectric element.

6. The method of claim 5 further comprising applying an alternating voltage between a pair of electrodes sandwiching said piezoelectric element in order to cause the ultrasonic vibration on said substrate.

7. The method of claim 5 wherein said piezoelectric element comprises a material selected from the group consisting of quartz crystal, potassium sodium tartrate, lithium niobate, barium titanate and lead titanate zirconate.

8. The method of claim 1 wherein the deposition of the film on said substrate is carried out by plasma chemical vapor deposition, photo chemical vapor deposition, thermal chemical vapor deposition, physical vapor deposition, evaporation, sputtering or laser ablation.

9. The method of claim 1 wherein said film comprises a material selected from the group consisting of silicon, diamond, ceramics, insulator, metal and superconductor.

10. The method of claim 1 wherein said film comprises a semiconductor.

11. The method of claim 1 wherein said characteristic is photoconductivity of said film.

12. The method of claim 1 wherein said characteristic is refractive index of said film.

13. The method of claim 1 wherein said characteristic is infrared absorption of said film.

14. A method for forming a film comprising the steps of:
providing a substrate in a film formation space;
introducing a reaction gas into said film formation space;
activating said reaction gas in said film formation space: and
depositing an amorphous silicon film on said substrate by plasma chemical vapor deposition,
wherein a surface acoustic wave is generated in said substrate during the deposition of said film with conditions of the generation of said surface acoustic wave being adjusted to obtain characteristics for said film wherein the characteristics are a function of the surface acoustic wave conditions.

15. The method of claim 14 wherein the deposition of said film on said substrate is carried out by plasma chemical vapor deposition, photo chemical vapor deposition, thermal chemical vapor deposition, physical vapor deposition, evaporation, sputtering or laser ablation.

16. The method of claim 14 wherein said film comprises a material selected from the group consisting of silicon, diamond, ceramics, insulator, metal and superconductor.

17. The method of claim 14 wherein said film is deposited on an uneven surface of said substrate.

18. The method of claim 14 wherein said film comprises a semiconductor.

19. A method for forming a film comprising the steps of:
providing a substrate in a film formation space;
introducing a reaction gas into said film formation space;
activating said reaction gas in said film formation space;
depositing an amorphous silicon film on said substrate by plasma chemical vapor deposition;
vibrating said substrate at an ultrasonic frequency during the deposition of said film,
wherein an amplitude of the vibration is varied with time.

20. The method of claim 19 wherein the vibration of said substrate is carded out intermittently.

* * * * *